(12) United States Patent
Goto

(10) Patent No.: US 9,040,844 B2
(45) Date of Patent: May 26, 2015

(54) ELECTRONIC COMPONENT MOUNTING BOARD HAVING A PLURALITY OF TERMINALS AND METHOD OF MANUFACTURE

(75) Inventor: Hideki Goto, Yokkaichi (JP)

(73) Assignee: SUMITOMO WIRING SYSTEMS, LTD., Mie (JP)

( * ) Notice: Subject to any disclaimer, the term of this patent is extended or adjusted under 35 U.S.C. 154(b) by 473 days.

(21) Appl. No.: 13/123,814

(22) PCT Filed: Dec. 14, 2009

(86) PCT No.: PCT/JP2009/006863
§ 371 (c)(1),
(2), (4) Date: Apr. 12, 2011

(87) PCT Pub. No.: WO2010/150329
PCT Pub. Date: Dec. 29, 2010

(65) Prior Publication Data
US 2011/0192641 A1 Aug. 11, 2011

(30) Foreign Application Priority Data

Jun. 25, 2009 (JP) .................................. 2009-151511

(51) Int. Cl.
*H05K 1/11* (2006.01)
*H05K 3/30* (2006.01)
(Continued)

(52) U.S. Cl.
CPC ........... *H05K 3/306* (2013.01); *Y10T 29/49149* (2013.01); *H01R 12/7082* (2013.01); *H01R 12/91* (2013.01); *H05K 3/3447* (2013.01); *H05K 2201/10189* (2013.01);
(Continued)

(58) Field of Classification Search
CPC ..... H01L 23/488; H01L 23/49; H01L 23/498; H01L 23/49811; H01L 23/49827; H01L 23/49537; H05K 1/11; H05K 1/14; H05K 1/141; H05K 3/34; H05K 3/3405; H05K 3/341; H05K 3/3415; H05K 3/3421; H05K 3/3447
USPC .......................... 174/267, 250, 255, 257, 261
See application file for complete search history.

(56) References Cited

U.S. PATENT DOCUMENTS 4,943,248 A * 7/1990 Colleran et al. ............. 439/850
6,643,134 B2 11/2003 Ashiya et al.
(Continued)

FOREIGN PATENT DOCUMENTS

JP U-55-75191 5/1980
JP A-7-263877 10/1995
(Continued)

OTHER PUBLICATIONS

International Search Report issued in International Patent Application No. PCT/JP2009/006863, dated Mar. 16, 2010.

*Primary Examiner* — Tremesha S Willis
(74) *Attorney, Agent, or Firm* — Oliff PLC

(57) ABSTRACT

A mounting board having a plurality of terminals. The ends of each of the plurality of terminals are inserted into and soldered to through-holes positioned in a printed board, and the terminals are mounted on the printed board. A plurality of pedestals are disposed on one side of the printed board. The pedestals support the terminals. The pedestals are integrally coupled to one another through deformable coupling portions. Mutual displacements among the pedestals are allowed by the coupling portions.

21 Claims, 4 Drawing Sheets

(51) Int. Cl.
*H01R 12/70* (2011.01)
*H01R 12/91* (2011.01)
*H05K 3/34* (2006.01)

(52) U.S. Cl.
CPC ............... *H05K 2201/10303* (2013.01); *H05K 2201/10424* (2013.01); *H05K 2201/10537* (2013.01)

(56) References Cited

U.S. PATENT DOCUMENTS

| | | | |
|---|---|---|---|
| 6,666,723 B2 * | 12/2003 | Fukumori et al. | 439/620.26 |
| 6,671,173 B2 | 12/2003 | Ashiya et al. | |
| 6,891,463 B2 | 5/2005 | Nagaoka | |
| 6,942,499 B2 | 9/2005 | Tanaka et al. | |
| 2006/0173114 A1 * | 8/2006 | Fujimoto et al. | 524/444 |

FOREIGN PATENT DOCUMENTS

| | | |
|---|---|---|
| JP | A-8-124635 | 5/1996 |
| JP | A-10-106653 | 4/1998 |
| JP | A-2002-270986 | 9/2002 |
| JP | A-2003-217437 | 7/2003 |
| JP | A-2008-35669 | 2/2008 |

* cited by examiner

ELECTRONIC COMPONENT MOUNTING BOARD HAVING A PLURALITY OF TERMINALS AND METHOD OF MANUFACTURE

BACKGROUND

1. Technical Field

The present disclosure relates to a mounting board, in particular, to a mounting board in which terminals are soldered on a printed board.

2. Background of the Disclosure

Heretofore, a mounting board that electrically connects electrical components to terminals has been known. In the mounting board, terminals to be connected to electrical components such as fuses, relays, and connectors that are provided with terminals are mounted on a printed board. For example, the mounting board has been studied to be utilized in an electrical control unit (ECU) for a motor vehicle. JP 2008-35669 A, JP 2002-270986β, JP 2003-217437β, and JP HEI 10(1998) 106653 A disclose some examples of the mounting board.

Heretofore, related art, that has been directed towards a means for mounting terminals on a printed board to connect electrical components to a printed board, have generally adopted soldering as the preferred fixing means. Firstly, the printed board is provided at its terminal mounting positions with through-holes that penetrate the printed board in its thickness direction, and terminals are inserted into the through-holes. Secondly, distal ends of the terminals inserted into the through-holes are soldered to the through-holes to form the mounting board.

In such mounting means of terminals by soldering, it is necessary to position the terminals on the printed board before soldering. However, there is a problem associated with this mounting means of terminals by soldering, that is the process of positioning and arranging the respective terminals on the printed board is a complicated procedure.

It is necessary to position and hold the terminals on the printed board in order to surely attach the terminals to the printed board at its given positions in a soldering step when producing the mounting board. Consequently, in the prior art, a single terminal or a plurality of terminals are secured to a single terminal support pedestal, jigs hold the pedestals, and the pedestals are positioned at the mounting positions on the printed board.

However, since the plurality of pedestals must be positioned on the printed board, the process of arranging the plurality of pedestals at given positions on the printed board has proven to require significant time and manpower. In addition, if the plurality of pedestals, that are independent from one another, are produced, the number of parts to be handled becomes great. Therefore, the process of controlling the parts and assembling the work becomes complicated and troublesome.

SUMMARY

In view of the above problems, an object of the present disclosure is to provide a mounting board having a novel structure in which a plurality of terminal support pedestals, on which terminals are mounted, can be efficiently disposed on a printed board and each terminal can be precisely mounted at a given position on the printed board.

A first aspect of the present disclosure is directed to a mounting board where the ends of a plurality of terminals are inserted into and soldered to through-holes in a printed board, and the terminals are mounted on the printed board. A plurality of pedestals are disposed on one side of the printed board. The pedestals support the terminals. The pedestals are integrally coupled to one another through deformable coupling portions. Mutual displacements among the pedestals are allowed by the coupling portions.

According to the first aspect, since a plurality of pedestals are integrally coupled to one another by the plurality of coupling portions, all of the plurality of pedestals can be positioned on the printed board together. Accordingly, the process of positioning the pedestals, which support the terminals with respect to the printed board, will be simplified, and the number of the positioning jigs can be reduced. In addition, since the plurality of pedestals are integrated, handling of the plurality of pedestals during the assembly of the mounting board is simplified and workability is enhanced. Furthermore, since the plurality of pedestals are integrated by the coupling portions, a control of pedestal parts becomes easy, loss of the parts is prevented, and a process of loading and unloading the pedestals onto and from a vehicle is simplified during transportation of the pedestals.

In addition, since the plurality of pedestals are coupled to one another by the coupling portions, sufficient clearances are defined between the pedestals at positions outside the coupling portions. Accordingly, when the terminals are soldered on the printed board, a working person can view positions to be soldered through the clearances, thereby firmly stabilizing quality during soldering.

A second aspect of the present invention is directed to the mounting board according to the first aspect. The coupling portions include bent parts.

According to the second aspect, since each coupling portion includes at least one bent part, each coupling portion is likely to be deformed easily, and mutual displacements of the pedestals can be advantageously allowed.

A third aspect of the present invention is directed to the mounting board according to the second aspect. Inner and outer peripheral surfaces of the bent parts are formed into smoothly curved surfaces.

According to the third aspect, it is possible to avoid a failure in molding such as a void caused on account of accumulation of a molding material in the bent parts. In result, a rate in failure of the mounting board can be reduced, thereby lowering a cost and enhancing efficiency in production.

According to the present invention, since the plural pedestals are integrated by the coupling portions, handling of the pedestals can be improved in a process of producing the mounting board and efficiency in production can be enhanced. Since the plural pedestals are positioned on the printed board all together, the number of positioning steps can be reduced. In addition, the number of jigs to be used for positioning can be reduced.

DETAILED DESCRIPTION OF EMBODIMENTS

Figure 1:
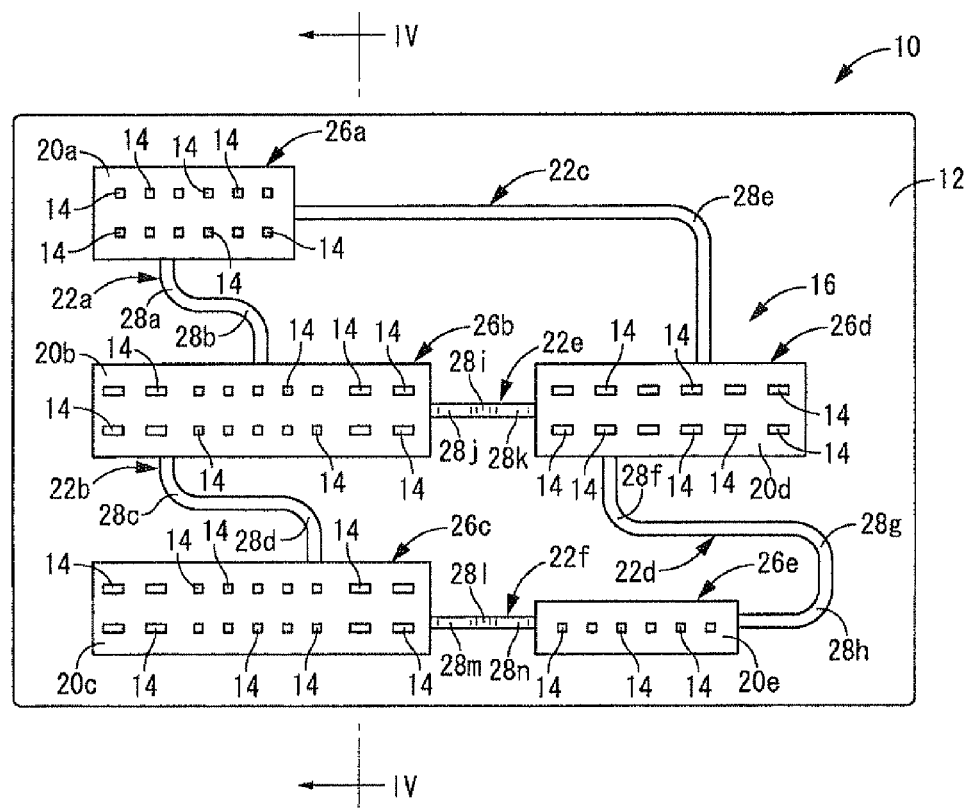
FIG. 1 is a plan view of a first embodiment of a mounting board in accordance with the present disclosure.
Figure 2:
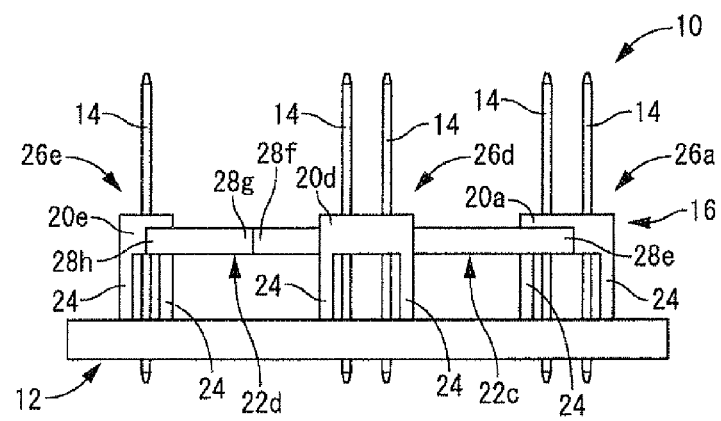
FIG. 2 is a right side elevation view of the mounting board shown in FIG. 1.

Referring now to the drawings, embodiments of a mounting board in accordance with the present disclosure will be described below.

FIGS. 1 to 4 show a first embodiment of a mounting board 10 in accordance with the present disclosure. The mounting board 10 includes a printed board 12, terminal metal elements (terminals) 14 mounted on the printed board 12, and a pedestal plate 16. It should be noted in the following description in principle that upper and lower directions designate upper and lower directions in FIG. 1, right and left directions designate right and left directions in FIG. 1, and a vertical direction designates upper and lower directions in FIG. 2.

The printed board 12 includes an insulation board made of hard synthetic resin or the like, and an electrical circuit made of an electrical conductive material such as copper alloy and formed on the insulation board by printed wiring. The printed board 12 is provided with through-holes 18 (see FIG. 4) that extend in a thickness direction of the printed board 12. The insulation board for the printed board 12 is made of a synthetic resin material in which epoxy resin is reinforced by glass fibers. The printed board has sufficient heat resistance.

The terminal metal elements 14 stand up on the printed board 12. The terminal metal elements 14 are rectangular rod-like metal elements made of an electrical conductive metal material such as copper alloy or treated with plating of copper alloy or the like. The terminal metal elements 14 extend in the vertical direction. Lower ends of the terminal metal elements 14 are inserted into and soldered to the through-holes 18, so that the terminal metal elements 14 are secured to the printed board 12 and are electrically connected to the printed wires.

The terminal metal elements 14 are supported on the pedestal plate 16. The pedestal plate 16 includes a plurality of pedestals 20 and a plurality of coupling portions 22a-22f that interconnect the pedestals 20 to one another. The pedestal plate 16 is made of a hard synthetic resin material. Each pedestal 20 is formed into a substantially rectangular block-like configuration and is provided integrally with support legs 24 (see FIG. 2) that protrudes downward from four corners taken in a plan view in the vertical direction. The terminal metal elements 14 are inserted into the plurality of through-holes 18 that penetrate the pedestals 20 in the vertical direction. When the plurality of terminal metal elements 14 are supported on the pedestals 20, these terminal metal elements 14 and pedestals 20 constitute connectors 22a-22c. The pedestal plate 16 comprises five pedestals 20a, 20b, 20c, 20d, and 20e.

The pedestals 20 are interconnected to one another by the coupling portions 22. Each coupling portion 22 has a substantially given shape in cross section and extends in its longitudinal direction. When both ends of each coupling portion 22 are integrated with different pedestals 20, the pedestals 20 are interconnected to one another by the coupling portions 22. Since each coupling portion 22 has substantially less area in cross sectional direction in comparison with the area along its length, a stiffness of the coupling portion 22 is set to be lower than that of the pedestal 20. Therefore, mutual movements of the pedestals 20 are allowed by deformations of the coupling portions 22. The coupling portions 22a to 22f will be explained in detail below.

The coupling portion 22a is formed into a substantially crank-like configuration taken in a plan view. The coupling portion 22a includes bent parts 28a and 28b each in a quarter of circle taken in a plan view and a straight part that extends in the right and left directions in FIG. 1 to interconnect the bent parts 28a and 28b to each other. The bent part 28a is coupled to the pedestal 20a through a straight part that extends in the upper and lower directions in FIG. 1. The bent part 28b is coupled to the pedestal 20b through a straight part that extends in the upper and lower directions in FIG. 1. Thus, a connector 26a and a connector 26b are coupled to each other through the coupling portion 22a.

The coupling portion 22b is formed into a substantially crank-like configuration taken in a plan view, as is the case with the coupling portion 22a. The coupling portion 22b includes bent parts 28c and 28d each in a quarter of circle taken in a plan view and a straight part that extends in the right and left directions to interconnect the bent parts 28c and 28d in FIG. 1. The bent part 28c is coupled to the pedestal 20b through a straight part that extends in the upper and lower directions in FIG. 1. The bent part 28d is coupled to the pedestal 20c through a straight part that extends in the upper and lower directions in FIG. 1. Thus, the connector 26b and a connector 26c are coupled to each other through the coupling portion 22b.

The coupling portion 22c is formed into a substantially L-shaped configuration taken in a plan view. The coupling portion 22c is provided on its intermediate position in the longitudinal direction with a bent part 28e in a quarter of circle taken in a plan view. The ends of the bent part 28e are coupled to the pedestals 20a and 20d through two straight parts, which extend in the right and left directions and in the upper and lower directions in FIG. 1, respectively. Thus, the connector 26a and a connector 26d are coupled to each other through the coupling portion 22c.

The coupling portion 22d includes bent parts 28f, 28g, and 28h each in a quarter of circle taken in a plan view. The bent part 28f and 28g are coupled to each other through a straight part that extends in the right and left directions in FIG. 1. The bent parts 28g and 28h are coupled to each other through a straight part that extends in the upper and lower directions in FIG. 1. The bent part 28f is coupled to the pedestal 20d through the straight part that extends in upper and lower directions in FIG. 1. The bent part 28h is coupled to the pedestal 20e through the straight part that extends in right and left directions in FIG. 1. Thus, the connector 26d and a connector 26e are coupled to each other through the coupling portion 22d.

Figure 3:
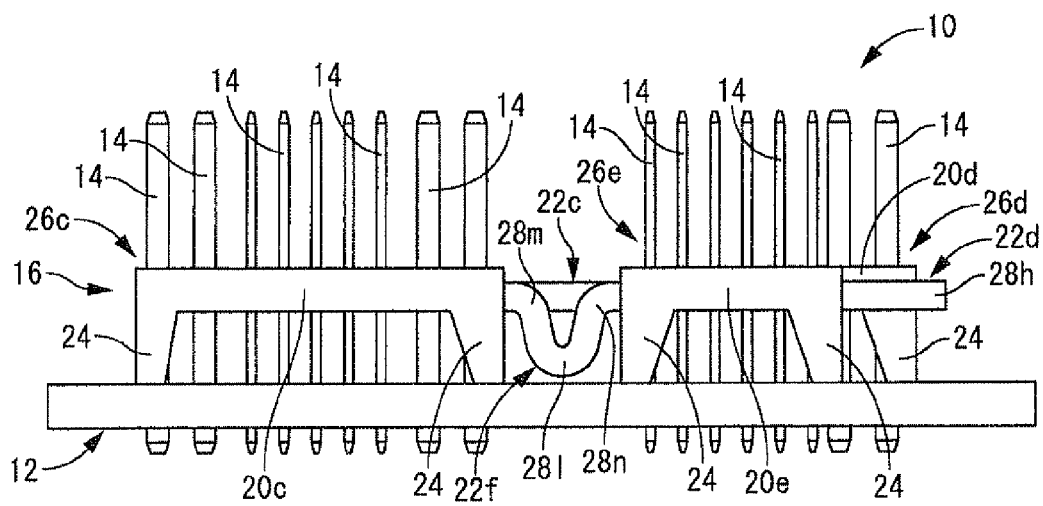
FIG. 3 is a front elevation view of the mounting board shown in FIG. 1.
Figure 4:
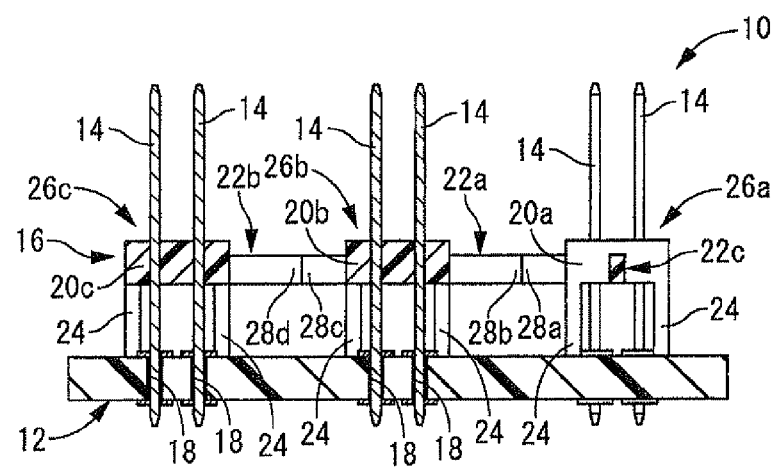
FIG. 4 is a cross section view of the mounting board taken along lines IV-IV in FIG. 1.

The coupling portion 22e extends straightly in a plan view, as shown in FIG. 1. The coupling portion 22e is provided on its intermediate position in the longitudinal direction with a bent part 28i that projects downward in a half-arc shape taken in a front elevation view, as shown in FIG. 3, and with bent parts 28j and 28k (FIG. 1) each in a quarter of circle. Both ends of the bent part 28i are coupled to bent parts 28j and 28k through the straight parts that extend in oppositely slanted directions. Furthermore, the bent part 28j is coupled to the pedestal 20b through the straight part that extends in a horizontal direction. The bent part 28k is coupled to the pedestal 20d through the straight part that extends in a horizontal direction. Thus, the connectors 26b and 26d are coupled to each other through the coupling portion 22e.

The coupling portion 22f has substantially the same construction as that of the coupling portion 22e. The coupling portion 22f is provided on its intermediate position in the longitudinal direction with a bent part 28l in a half-arc shape taken in a front elevation view in FIG. 3 and with bent parts 28m and 28n each in a quarter of circle taken in a front elevation view in FIG. 3. Both ends of the bent part 28l are coupled to bent parts 28m and 28n. Furthermore, the bent part 28m is coupled to the pedestal 20c and the bent part 28n is coupled to the pedestal 20e. Thus, the connectors 26c and 26e are coupled to each other through the coupling portion 22f.

Each bent part 28 has curved inner and outer peripheral surfaces. In particular, each bent part 28 is formed into an arc-shaped configuration that extends with a constant area in cross section while being curved. Furthermore, each of the straight parts of the coupling portions 28 extend in tangential line directions on an end of each of the bent parts 28a to 28n. A boundary area between the bent part 28 and the straight part is bent smoothly without creating a sharp crest.

Preferably, each coupling portion 22 has a length of more than 10 mm. Furthermore, each coupling portion 22 has a rectangular area in cross section of 1 mm×2 mm. The coupling portion 22 has a narrower width and a thinner thickness than those of the pedestal 20 through the longitudinal direction. A ratio (A/L) of an area in cross section (A) to a length (L) of each coupling portion 22 is set to be sufficiently small. By setting these factors to preferable values, the coupling portion can be deformed readily. Consequently, even if a small force is applied to the terminal metal elements 14, the pedestals 20 can be displaced readily.

The pedestal plate 16 constructed above is superimposed on one side of the printed board 12 to be positioned on and secured to the printed board 12. Thus, the mounting board 10 is formed. That is, firstly, the printed board 12 and terminal metal elements 14 are prepared. The pedestals 20 and coupling portions 22 are integrally molded from a synthetic resin material to produce the pedestal plate 16. Secondly, the respective terminal metal elements 14 are built in the respective pedestals 20 of the pedestal plate 16 to form the connectors 26. The pedestal plate 16, to which the terminal metal elements 14 are attached, is superimposed and positioned on the printed board 12. The pedestal plate 16 is positioned and held on the printed board 12 by means of positioning jigs (not shown), with the terminal metal elements 14 being inserted into the through-holes 18 in the printed board 12.

Furthermore, the lower ends of the terminal metal elements 14 are soldered to the printed board 12, with the printed board 12 and pedestal plate 16 being fixed by the jigs. In more detail, firstly, the lower ends of the terminal metal elements 14 that protrude downward from the through-holes 18, and land portions of the rear side peripheral edges around the through-holes 18 are heated beforehand. Then, flux is applied onto the terminal metal elements 14 and land portions. Thereafter, when the lower ends of the terminal metal elements 14 are dipped in molten solder in a solder tank, molten solder will enter clearances between the through-holes 18 and the terminal metal elements 14 by capillarity. Afterwards, a person views through clearances in the pedestal plate 16 to confirm whether the solder sufficiently enters the through-holes 18, and if so, the soldering step is completed. Thus, the terminal metal elements 14 are secured to the printed board 12 and are electrically connected to the printed wires on the printed board 12. Thus, the mounting board 10 is formed.

According to the mounting board 10 constructed above, since the plural pedestals 20a to 20e are integrally coupled to one another by the plural coupling portions 22a to 22f, it is possible to position the plural pedestals 20a to 20e all together by positioning jigs for positioning the whole pedestal plate 16. Accordingly, it is possible to greatly reduce the number of positioning jigs.

Since the coupling portions 22 that couple the pedestals 20 to one another is formed to have a small size along its width, it is possible for a person to view the printed board 12 through the clearances between the pedestals 20 from a position above the pedestal plate 16, when the pedestal plate 16 is disposed on the printed board 12. Therefore, the pedestal plate 16 can be easily positioned on the printed board 12 by viewing.

In addition, since the working person can view the through-holes 18 from the clearances between the pedestals 20, it is possible for the working person to easily view the conditions of solder in the through-holes 18, when the terminal metal elements 14 are soldered on the printed board 12. Accordingly, the terminal metal elements 14 are firmly soldered on the printed board 12 to avoid failures in mounting.

Since the coupling portions 22 that couple the pedestals 20 to one another have sufficiently small areas in cross sectional direction, and are provided on intermediate positions with bent parts 28, stiffness of each coupling portion 22 can be lowered in directions opposed to the pedestals 20. Thus, the coupling portion 22 is deformable and mutual positions among pedestals 20 can be easily altered by deformations of coupling portions 22. Therefore, even if mounting positions of the pedestals 20 are changed on the printed board 12 by expansion and contraction of the printed board 12 caused on account of heating when soldering the terminal metal elements 14 on the printed board 12, the pedestals 20 on the pedestal plate 16 follow the deformation of the printed board 12 to be displaced. Consequently, the connectors 26 comprising the terminal metal elements 14 and pedestals 20 can be mounted at predetermined positions on the printed board 12, thereby avoiding cracks in the solder on account of excessive stresses applied to the solder.

The bent parts 28 of the coupling portions 22 are formed into arc-shaped configurations taken in a plan view and the inner and outer peripheral surfaces are curved smoothly to extend in the peripheral direction. Accordingly, when the pedestal plate 16 is molded, a molten synthetic resin material will easily flow into a part corresponding to the coupling portions 22 in a cavity in a mold without causing any void, thereby stably producing the pedestal plate 16 provided with the coupling portions 22 having given configurations without causing failures in molding.

Since the positioning jigs position and support the pedestal plate 16 with respect to the printed board 12, the terminal metal elements 14 are positioned on the printed board 12 without contacting with the positioning jigs. Accordingly, it is possible to prevent foreign particles such as flux from adhering to the terminal metal elements 14 in comparison with the case where the positioning jigs support the terminal metal elements 14 directly.

Figure 5:
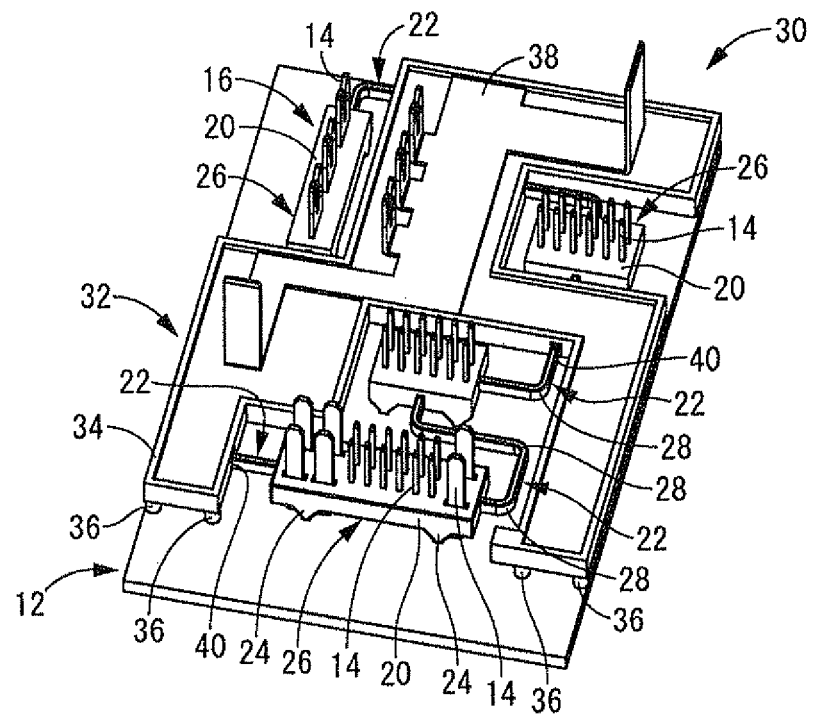
FIG. 5 is a perspective view of a second embodiment of the mounting board in accordance with the present disclosure, illustrating the mounting board taken from the plan view side.

FIG. 5 shows a second embodiment of a mounting board 30 in accordance with the present invention. The mounting board 30 includes a pedestal plate 16, a printed board 12, and an insulation plate 32 superimposed on the plate 16 and board 12. The following descriptions omit explanation of the same members and positions in the second embodiment as those in the first embodiment by giving the same signs to them.

Figure 6:
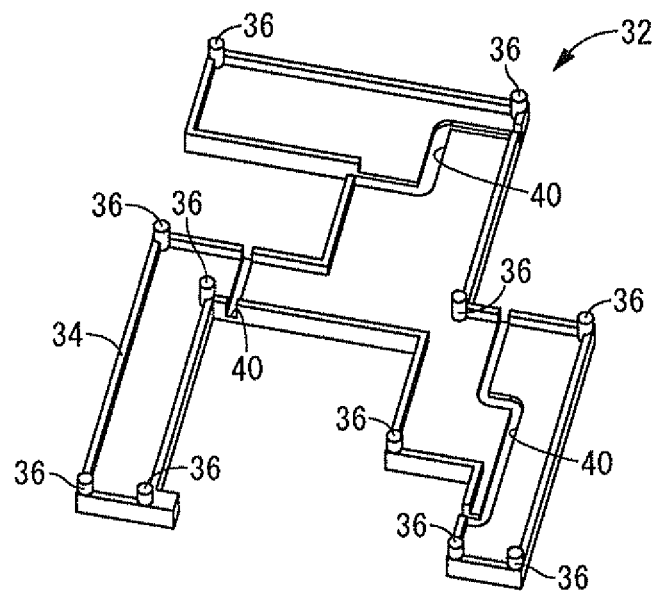
FIG. 6 is perspective view of an insulation plate constituting the mounting board shown in FIG. 5, illustrating the insulation plate taken from a bottom view side.

The insulation plate 32 is formed into a substantially plate-like configuration made of an insulation material such as synthetic resin. The insulation plate 32 extends in a plane shape across the coupling portions 22 at areas outside the pedestals 20 on the pedestal plate 16. The insulation plate 32 is integrally provided on an outer peripheral edge with a reinforcing rib 34 that protrudes in both sides in a thickness direction of the plate 32. Furthermore, as shown in FIG. 6, the insulation plate 32 is provided on a bottom surface with a plurality of support poles 36 that have substantially cylindrical column shapes and protrude downward (to a side of the printed board 12). A plate-like bus bar 38 made of an electrically conductive metal material is disposed on an upper surface of the insulation plate 32.

The insulation plate 32 is provided across the coupling portions 22, the insulation plate having containing grooves 40 and being superimposed on the printed board 12. Each containing groove 40 extends in accordance with the shape of each coupling portion 22 and is open in a rear side of the insulation plate 32 through the whole length of the groove 40. Opposite ends of each groove 40 are open at the side surface of the insulation plate 32. Although the containing grooves are formed in accordance with the shapes of the coupling portions 22, small clearances are defined between the coupling portions 22 and the containing grooves 40. Thus, it is possible to easily contain the coupling portions 22 in the containing grooves 40.

As shown in FIG. 5, after the pedestal plate 16 is put on the printed board 12, the insulation plate 32 is superimposed downward on the pedestal plate 16. When the support poles 36 of the insulation plate 32 contact with the upper surface of the printed board 12, the insulation plate 32 is supported on the printed board 12. The coupling portions 22 of the pedestal plate 16 are accommodated in the containing grooves 40 in the insulation plate 32.

In the mounting board 30 constructed above, since the insulation plate 32 is superimposed on the printed board 12, the surface of the insulation plate 32 can be utilized as a wiring space for arranging electrical circuits including the bus bar 38. Accordingly, since the bus bar 38 or the like can be wired on a space of the insulation plate 32 outside the pedestal plate 16, it is possible to arrange the bus bar 38 (electrical circuit) and other electrical members on the insulation plate 32 with high flexibility in design.

Figure 7:
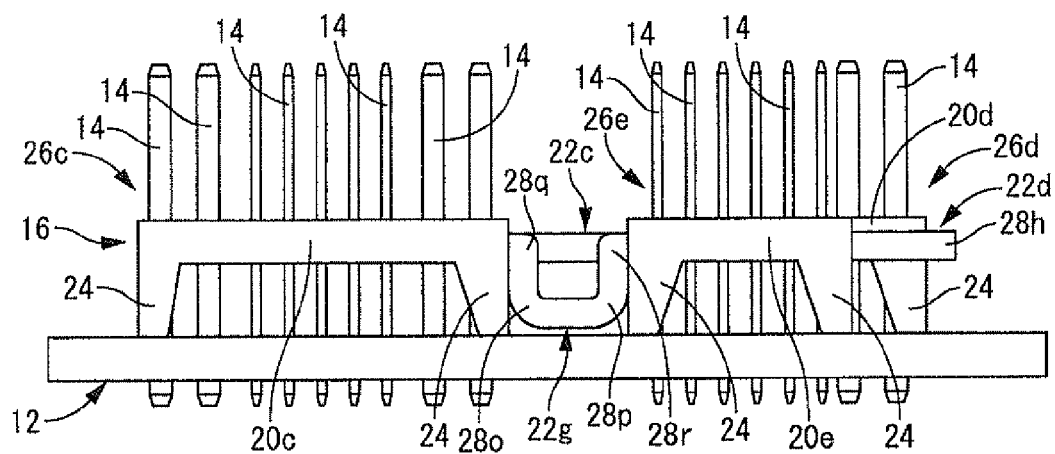
FIG. 7 is a front elevation view of another embodiment of the mounting board in accordance with the present disclosure.

The embodiments of the mounting board in accordance with the present invention are described above. However, it should be noted that the present invention is not limited to the above embodiments. For example, a specific construction of the coupling portion can adopt a coupling portion 22g shown in FIG. 7. That is, the coupling portion 22g includes bent parts 28o, 28p, 28q, and 28r each in a quarter-circular shape. The bent parts 28o and 28q and the bent parts 28p and 28r are coupled to each other by straight parts that extend in the vertical direction. The bent parts 28o and 28p are coupled to each other by a straight part that extends in a horizontal direction. The coupling portion 22g is formed into a downward convex shape-like configuration, as a whole. Furthermore, since the bent part 28q is coupled to the pedestal 20c and the bent part 28r is coupled to the pedestal 20e, the connectors 26c and 26e are coupled to each other through the coupling portion 22g. Thus, the coupling portion may include the bent part on at least a part of the coupling portion in a longitudinal direction. The respective shapes including a cross section are not limited in particular.

A plurality of coupling portions may be provided between two pedestals. For example, a pedestal is formed into a rectangular shape taken in a plan view, and a pair of coupling portions that extend from opposite sides of the pedestal in its short axial direction may be disposed on opposite sides of the pedestal in its long axial direction, thereby preventing the pedestal from being twisted about the long axis.

The bent part is not always bent in a plane direction of the printed board or a thickness direction of the printed board. For example, the bent part may be bent slant with the plane direction or the thickness direction of the printed board. The bent part may be curved, as a whole. A combination of the bent parts and straight parts may be adopted. Furthermore, the bent part is not limited to a curved configuration. For example, the bent part may be formed into a V-shaped configuration in which two slant straight parts are intersected to each other. A single coupling portion may be provided with a plurality of bent parts. The coupling portion may be branched at an intermediate position in the longitudinal direction.

Since at least a part of a force acting on the coupling portion becomes a shearing component, even if the coupling portion extends straightly in a slant or orthogonal direction with respect to an imaginary direction in which the pedestals may be displaced from one another, the coupling portion can be easily deformed. In result, it is possible to prevent an external force due to mutual displacements among the pedestals from being transmitted to a solder, thereby avoiding cracks in the solder.

Terminals to be supported on the pedestal may be any terminals for fuses and relays as well as connecting terminals for a connector. In this case, since parts of the terminals for fuses and relays to be soldered can be straighten, jigs to be used for soldering can be more simplified. The shapes and numbers of the pedestals are not limited in particular. For example, the pedestal may be a square shape or a rectangular shape taken in a plan view. A single terminal metal element is supported on a single pedestal.

The invention claimed is:

1. A mounting board comprising:
a printed board defining a plurality of through-holes;
a plurality of terminals mounted on the printed board, and having ends inserted into and soldered to the through-holes;
deformable coupling portions; and
a plurality of pedestals disposed on one side of the printed board, the pedestals supporting the terminals and being integrally coupled to one another through the deformable coupling portions, clearances being defined between the plurality of pedestals at positions outside the deformable coupling portions, wherein
the deformable coupling portions are configured to allow mutual displacements among the pedestals.

2. The mounting board of claim 1, wherein
the deformable coupling portions include a plurality of bent parts.

3. The mounting board of claim 2, wherein
the plurality of bent parts include inner and outer peripheral surfaces that are formed into smoothly curved surfaces.

4. A mounting board assembly, comprising:
a printed board defining a plurality of through-holes;
a plurality of terminals mounted on the printed board;
a pedestal plate having a plurality of pedestals; and
deformable coupling portions positioned between the plurality of pedestals, wherein
the deformable coupling portions integrally couple respective pairs of the plurality of pedestals to one another,
clearances are configured between the plurality of pedestals at positions outside the deformable coupling portions, and
the deformable coupling portions are configured to allow mutual displacements among the pedestals.

5. The mounting board assembly of claim 4, wherein
ends of the plurality of terminals are inserted into and soldered to the plurality of through-holes.

6. The mounting board assembly of claim 4, wherein
the deformable coupling portions include a plurality of bent parts.

7. The mounting board assembly of claim 6, wherein
the plurality of bent parts have inner and outer peripheral surfaces formed into substantially smooth curved surfaces.

8. The mounting board assembly of claim 6, wherein
the plurality of bent parts are formed into quarter-circle arcs.

9. The mounting board assembly of claim 6, wherein the plurality of bent parts are formed into V-shaped configurations.

10. The mounting board assembly of claim 4, wherein
the pedestal plate is positioned on top of the printed board and is held by a plurality of positioning jigs, and the plurality of terminals are mounted on the printed board without contacting any of the plurality of positioning jigs.

11. The mounting board assembly of claim 4, further comprising
an insulation plate superimposed on the pedestal plate.

12. The mounting board assembly of claim 11, wherein
the insulation plate is formed from a synthetic resin.

13. The mounting board assembly of claim 12, wherein
the insulation plate includes a plurality of containing grooves that extend in accordance with a shape of each of the deformable coupling portions.

14. The mounting board assembly of claim 13, wherein
the insulation plate includes a wiring space for arranging electrical circuits.

15. A method of manufacturing a mounting board, comprising:
providing a printed board having a plurality of printed wires;
providing a plurality of terminals having open ends and attachable ends;
integrally molding a plurality of pedestals and deformable coupling portions from a synthetic resin to produce a pedestal plate,
wherein the deformable coupling portions integrally couple the plurality of pedestals to one another, clearances being defined between the plurality of pedestals at positions outside the deformable coupling portions, and
the deformable coupling portions are configured to allow mutual displacements among the plurality of pedestals;
positioning the plurality of terminals within the plurality of pedestals to form a plurality of connectors;
superimposing the pedestal plate, to which the terminals are attached, to the printed board by securely positioning the pedestal plate on top of the printed board,
wherein the superimposed pedestal plate is held on the printed board by a plurality of positioning jigs; and
soldering the attachable ends of the terminals to the printed board such that the attachable ends are electrically connected to the plurality of printed wires on the printed board.

16. The method of manufacturing the mounting board according to claim 15, further comprising:
heating peripheral edges that define a plurality of through-holes; and
applying a flux onto the plurality of terminals and the peripheral edges.

17. The method of manufacturing a mounting board of claim 15, wherein
the soldering of the attachable ends of the terminal includes:
dipping the attachable ends of the terminals in molten solder; and
filling clearances between the plurality of through-holes and the plurality of terminals with molten solder,
wherein the clearances are filled by capillarity.

18. The mounting board of claim 1, wherein
the deformable coupling portions are formed from a synthetic resin.

19. The mounting board assembly of claim 4, wherein
the deformable coupling portions are formed from a synthetic resin.

20. A mounting board comprising:
a printed board defining a plurality of through-holes;
a plurality of terminals mounted on the printed board, and having ends inserted into and soldered to the through-holes;
deformable coupling portions; and
a plurality of pedestals disposed on one side of the printed board, the pedestals supporting the terminals and being integrally coupled to one another through the deformable coupling portions, clearances being defined between the plurality of pedestals at positions outside the deformable coupling portions,
the plurality of terminals, the plurality of pedestals, and the deformable coupling portions being all distinct from one another.

21. A mounting board assembly, comprising:
a printed board defining a plurality of through-holes;
a plurality of terminals mounted on the printed board;
a pedestal plate having a plurality of pedestals; and
deformable coupling portions positioned between the plurality of pedestals, wherein
the deformable coupling portions integrally couple respective pairs of the plurality of pedestals to one another,
clearances are configured between the plurality of pedestals at positions outside the deformable coupling portions, and
the plurality of terminals, the plurality of pedestals, and the deformable coupling portions are all distinct from one another.

* * * * *